United States Patent
Matsushita

(10) Patent No.: US 11,769,864 B2
(45) Date of Patent: Sep. 26, 2023

(54) SUBSTRATE FOR MOUNTING A LIGHT-EMITTING ELEMENT AND CIRCUIT BOARD FOR MOUNTING A LIGHT-EMITTING ELEMENT THAT INCLUDES IT, AND LIGHT-EMITTING ELEMENT MODULE

(71) Applicant: KYOCERA Corporation, Kyoto (JP)

(72) Inventor: Kouji Matsushita, Satsumasendai (JP)

(73) Assignee: KYOCERA Corporation, Kyoto (JP)

(*) Notice: Subject to any disclaimer, the term of this patent is extended or adjusted under 35 U.S.C. 154(b) by 763 days.

(21) Appl. No.: 16/636,537

(22) PCT Filed: Sep. 26, 2018

(86) PCT No.: PCT/JP2018/035664
§ 371 (c)(1),
(2) Date: Feb. 4, 2020

(87) PCT Pub. No.: WO2019/065726
PCT Pub. Date: Apr. 4, 2019

(65) Prior Publication Data
US 2021/0159375 A1    May 27, 2021

(30) Foreign Application Priority Data
Sep. 28, 2017    (JP) .................. 2017-188494

(51) Int. Cl.
*H01L 33/60* (2010.01)
*H01L 33/62* (2010.01)
*C04B 35/111* (2006.01)

(52) U.S. Cl.
CPC ............ *H01L 33/62* (2013.01); *C04B 35/111* (2013.01); *H01L 33/60* (2013.01); *C04B 2235/3206* (2013.01); *C04B 2235/3217* (2013.01); *C04B 2235/3418* (2013.01); *C04B 2235/442* (2013.01); *C04B 2235/783* (2013.01); *C04B 2235/786* (2013.01); *H01L 2933/0066* (2013.01)

(58) Field of Classification Search
CPC ....... H01L 33/60; H01L 33/62; H01L 33/641; H01L 23/15; H01L 23/36; H01L 23/3731;
(Continued)

(56) References Cited

U.S. PATENT DOCUMENTS 8,981,630 B2   3/2015  Shikata et al.
9,108,887 B2   8/2015  Nishimura et al.
(Continued)

FOREIGN PATENT DOCUMENTS

CN   103492345 A  *  1/2014  ............ C04B 35/111
CN   109844940 A     6/2019
(Continued)

OTHER PUBLICATIONS

Machine translation of CN-103492345-A, 40 pages. (Year: 2014).*

*Primary Examiner* — Matthew E. Hoban
*Assistant Examiner* — Lynne Edmondson
(74) *Attorney, Agent, or Firm* — Volpe Koenig

(57) ABSTRACT

A substrate for mounting a light-emitting element according to the present disclosure contains a crystal particle of aluminum oxide and is composed of an alumina-based ceramic that contains 97% by mass or more of Al as a value of an $Al_2O_3$ equivalent among 100% by mass of all components thereof. An average value of an equivalent circle diameter of the crystal particle is 1.1 μm or greater and 1.8 μm or less and a standard deviation of an equivalent circle diameter thereof is 0.6 μm or greater and 1.4 μm or less.

7 Claims, 1 Drawing Sheet

(58) Field of Classification Search
CPC ... H01L 2924/15787; H01L 2933/0066; C04B 2235/3206; C04B 2235/3418; C04B 2235/3217; C04B 2235/5436; C04B 2235/786; C04B 2235/5409; C04B 2235/783; C04B 35/10; C04B 35/111; C04B 35/00; C04B 41/5031; H05K 3/4629; H05K 2201/2054
See application file for complete search history.

(56) References Cited

U.S. PATENT DOCUMENTS

| | | |
|---|---|---|
| 2012/0177909 A1 | 7/2012 | Uchino et al. |
| 2013/0201598 A1* | 8/2013 | Ishikawa ............... H02N 13/00 216/13 |
| 2014/0240995 A1 | 8/2014 | Toda et al. |
| 2020/0049433 A1 | 2/2020 | Matsushita |

FOREIGN PATENT DOCUMENTS

| | | |
|---|---|---|
| CN | 110869334 A | 3/2020 |
| EP | 3534398 A1 | 9/2019 |
| EP | 3647296 A1 | 5/2020 |
| JP | 2012-067008 A | 4/2012 |
| JP | 2012-180275 A | 9/2012 |
| JP | 2016-040209 A | 3/2016 |
| JP | 2017-079328 A | 4/2017 |
| WO | 2012/043659 A1 | 4/2012 |
| WO | 2013/047087 A1 | 4/2013 |

\* cited by examiner

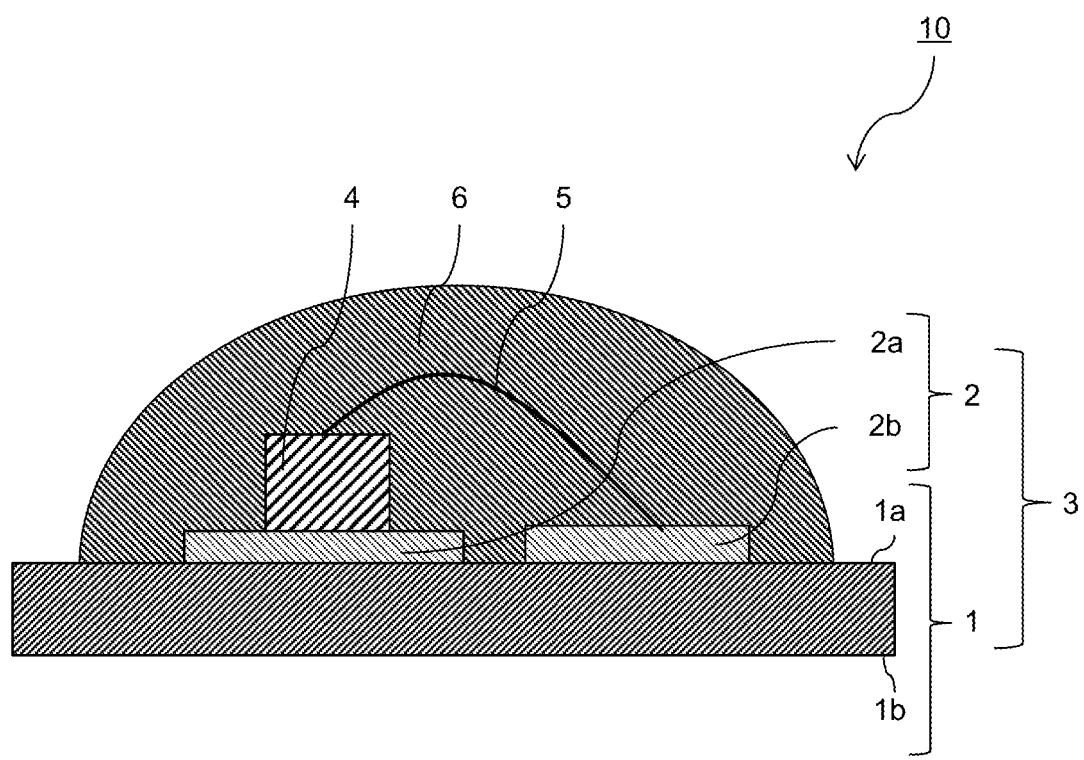

SUBSTRATE FOR MOUNTING A LIGHT-EMITTING ELEMENT AND CIRCUIT BOARD FOR MOUNTING A LIGHT-EMITTING ELEMENT THAT INCLUDES IT, AND LIGHT-EMITTING ELEMENT MODULE

CROSS-REFERENCE TO RELATED APPLICATION(S)

This application is a national stage application of International Application No. PCT/JP2018/035664, filed on Sep. 26, 2018, which designates the United States, the entire contents of which are herein incorporated by reference, and which is based upon and claims the benefit of priority to Japanese Patent Application No. 2017-188494, filed on Sep. 28, 2017, the entire contents of which are herein incorporated by reference.

FIELD

The present disclosure relates to a substrate for mounting a light-emitting element and a circuit board for mounting a light-emitting element that includes it, and a light-emitting element module.

BACKGROUND

For a general illumination or a light source of an electronic display board, and further, a liquid crystal backlight of a mobile phone device, a personal computer, a television set, and the like, a light-emitting element (LED) module is widely utilized. Such a light-emitting element module has an advantage such as a high brightness, a long life, or a low power consumption.

Such a light-emitting element module is provided by mounting a light-emitting element on a base that is provided as a piece from a substrate for mounting a light-emitting element, via a metal layer. Then, for one of materials of such a base, that is, a substrate for mounting a light-emitting element, an alumina-based ceramic with an excellent insulation property and mechanical characteristic and a less aging degradation is proposed (see, for example, Patent Literature 1).

CITATION LIST

Patent Literature

Patent Literature 1: International Publication No. 2012/043659

SUMMARY

A substrate for mounting a light-emitting element according to the present disclosure contains a crystal particle of aluminum oxide and is composed of an alumina-based ceramic that contains 97% by mass or more of Al as a value of an $Al_2O_3$ equivalent among 100% by mass of all components thereof. Then, an average value of an equivalent circle diameter of such a crystal particle is 1.1 μm or greater and 1.8 μm or less and a standard deviation of an equivalent circle diameter thereof is 0.6 μm or greater and 1.4 μm or less.

Furthermore, a circuit board for mounting a light-emitting element according to the present disclosure includes a base that is provided as a piece from the substrate for mounting a light-emitting element that is configured as described above and a metal layer that is located on such a base.

Furthermore, a light-emitting element module according to the present disclosure includes the circuit board for mounting a light-emitting element that is configured as described above and a light-emitting element that is located on the metal layer.

BRIEF DESCRIPTION OF DRAWINGS

FIG. 1 is a cross-sectional view that illustrates an example of a configuration of a light-emitting element module according to the present disclosure.

DESCRIPTION OF EMBODIMENTS

A base that is used for mounting of a light-emitting element is manufactured by cutting and dividing one substrate for mounting a light-emitting element that is composed of an alumina-based ceramic so as to provide a piece with a desired size by using a rotating disk where an industrial diamond is embedded therein, or the like, from a viewpoint of mass productivity thereof. A so-called multiple-piece process is executed. Accordingly, facilitation of division as well as a high reflectance is desired for a substrate for mounting a light-emitting element.

Hereinafter, an example of a substrate for mounting a light-emitting element and a circuit board for mounting a light-emitting element that includes a metal layer on a base that is provided as a piece from a substrate for mounting a light-emitting element, and a light-emitting element module, according to the present disclosure, will be explained by using FIG. 1. Additionally, FIG. 1 is a cross-sectional view that illustrates an example of a configuration of a light-emitting element module according to the present disclosure.

A light-emitting element module 10 according to the present disclosure is provided by mounting a light-emitting element 4 via a metal layer 2a (2) that is located on a surface 1a of a base 1. In other words, it is also considered that the light-emitting element module 10 according to the present disclosure includes the light-emitting element 4 on the metal layer 2 in a circuit board for mounting a light-emitting element 3 according to the present disclosure. Then, the circuit board for mounting a light-emitting element 3 according to the present disclosure is provided with a configuration that includes the base 1 and the metal layer 2.

Herein, FIG. 1 illustrates an example where the light-emitting element 4 and a metal layer 2b are electrically connected by a bonding wire 5. Furthermore, FIG. 1 illustrates an example where the light-emitting element 4, the metal layer 2, and the bonding wire 5 are covered by a sealing member 6 that is composed of a resin or the like.

Then, the base 1 that constitutes the light-emitting element module 10 and the circuit board for mounting a light-emitting element 3 according to the present disclosure is obtained by dividing a substrate for mounting a light-emitting element.

Herein, a substrate for mounting a light-emitting element according to the present disclosure contains a crystal particle of aluminum oxide (that will also be simply described as a crystal particle below) and is composed of an alumina-based ceramic that contains 97% by mass or more of Al as a value of an $Al_2O_3$ equivalent among 100% by mass of all components thereof. Thus, a substrate for mounting a light-emitting element according to the present disclosure is composed of an alumina-based ceramic and thereby has a high thermal conductivity and an excellent insulation property.

Herein, it is sufficient to calculate a content of Al as a value of an $Al_2O_3$ equivalent in a substrate for mounting a light-emitting element according to the present disclosure by measuring a content of Al by using an ICP optical emission spectrometer (ICP) or an X-ray fluorescence spectrometer (XRF) and subsequently converting it into $Al_2O_3$. Additionally, for a content of a contained component other than Al, a content of $Al_2O_3$ may be provided as a value that is provided by executing qualitative analysis by using an XRF, subsequently obtaining, for a detected element, a content thereof, by an ICP or an XRF, and subtracting it from 100% by mass.

Moreover, a crystal particle in a substrate for mounting a light-emitting element according to the present disclosure is provided in such a manner that an average value of an equivalent circle diameter thereof is 1.1 μm or greater and 1.8 μm or less and a standard deviation of an equivalent circle diameter thereof is 0.6 μm or greater and 1.4 μm or less.

A substrate for mounting a light-emitting element according to the present disclosure satisfies a configuration as described above and thereby has both a high reflectance and a high divisibility. Herein, a high reflectance refers to a reflectance at 500 nm that is 91.0% or greater. Additionally, for a measurement method for a reflectance at 500 nm, it is sufficient to execute measurement on a condition of a standard light source D65, a wavelength range of 360 to 740 nm (a visible light region), a field of view of 10°, and an illumination diameter of 3×5 mm by using a spectrophotometric colorimeter (produced by Minolta, Inc., CM-3700A) and read a reflectance at 500 nm from a measurement result.

If an average value of an equivalent circle diameter of a crystal particle is less than 1.1 μm, a mechanical strength of a substrate for mounting a light-emitting element is excessively high, so that a divisibility is degraded. Furthermore, if an average value of an equivalent circle diameter of a crystal particle is greater than 1.8 μm, a crystal particle with a large equivalent circle diameter is increased, so that a reflectance is degraded because such a crystal particle with a large equivalent circle diameter readily damps a wavelength in a visible light region. Furthermore, if a standard deviation of an equivalent circle diameter of a crystal particle is less than 0.6 μm, a number of a crystal particle with a large equivalent circle diameter that readily produces a crack at a time of dividing is excessively low, so that a divisibility is degraded. Furthermore, if a standard deviation of an equivalent circle diameter of a crystal particle is greater than 1.4 μm, a number of a crystal particle with a large equivalent circle diameter that readily damps a wavelength in a visible light region is excessively high, so that a reflectance is degraded.

Herein, it is sufficient to measure an average value of an equivalent circle diameter and a standard deviation of an equivalent circle diameter in a crystal particle of a substrate for mounting a light-emitting element according to the present disclosure, according to a following method.

First, a surface of a substrate for mounting a light-emitting element according to the present disclosure is mirror-polished to a depth of approximately 10 μm and thermal etching is executed at a temperature that is 50 to 100° C. lower than a firing temperature. Herein, a measurement result for a surface where thermal etching is executed thereon is regarded as a measurement result for a surface of a substrate for mounting a light-emitting element according to the present disclosure. Then, observation is executed at 500 to 3000-fold magnification by using a scanning electron microscope (SEM) and a range where a surface area thereof is 1344 μm² (where, for example, a length in a horizontal direction is 42 μm and a length in a vertical direction is 32 μm) is image-captured. Then, a contour of a crystal particle is traced on an image-captured photograph and subsequently image analysis thereof is executed by applying a technique of particle analysis of image analysis software "A zo-kun" (a registered trademark, produced by Asahi Kasei Engineering Corporation, and additionally, in a case where image analysis software "A zo-kun" is described below, image analysis software produced by Asahi Kasei Engineering Corporation is indicated thereby), so that it is possible to obtain an average value of an equivalent circle diameter and a standard deviation of an equivalent circle diameter. Herein, for an analysis condition of image analysis software "A zo-kun", it is sufficient that a lightness of a crystal particle is "light", a method for binarization is "manual", a small graphic elimination surface area is 0.002 μm, and a threshold value that is an index that indicates light and dark of an image is 50 or greater and 200 or less.

Furthermore, when A is an average value of an equivalent circle diameter of a crystal particle and B is a standard deviation of an equivalent circle diameter of a crystal particle, a ratio of B/A may be 0.6 or greater and 0.8 or less. If such a configuration is satisfied, a substrate for mounting a light-emitting element according to the present disclosure has both a more excellent reflectance and divisibility.

Furthermore, a crystal particle in a substrate for mounting a light-emitting element according to the present disclosure may be provided in such a manner that a crystal particle with an equivalent circle diameter that is 0.8 μm or less is 25% or more and 40% or less among 100% of a total number thereof. Herein, a crystal particle with an equivalent circle diameter that is 0.8 μm or less reduces diffused reflection of visible light and increases a reflectance. Then, if a ratio of a number of a crystal particle with an equivalent circle diameter that is 0.8 μm or less satisfies a numerical range as described above, a substrate for mounting a light-emitting element according to the present disclosure further improves a reflectance while a divisibility is maintained.

Herein, it is sufficient to calculate a number rate of a crystal particle with an equivalent circle diameter that is 0.8 μm or less by applying a technique of particle analysis of image analysis software "A zo-kun" to execute image analysis according to a method that is identical to that for measuring an average value of an equivalent circle diameter of a crystal particle and a standard deviation of an equivalent circle diameter of a crystal particle as described above.

Furthermore, within a range of a surface area of 1344 μm² on a surface of a substrate for mounting a light-emitting element according to the present disclosure, a number of a crystal particle with an equivalent circle diameter that is 2 μm or greater and an aspect ratio that is 2 or greater may be 10 or more and 25 or less. Herein, a crystal particle with an equivalent circle diameter that is 2 μm or greater and an aspect ratio that is 2 or greater improves a divisibility. Then, if a number of a crystal particle with an equivalent circle diameter that is 2 μm or greater and an aspect ratio that is 2 or greater satisfies a numerical range as described above, a substrate for mounting a light-emitting element according to the present disclosure further improves a divisibility while a reflectance is maintained.

Herein, it is sufficient to calculate a number of a crystal particle with an equivalent circle diameter that is 2 μm or greater and an aspect ratio that is 2 or greater by applying a technique of particle analysis of image analysis software "A zo-kun" to execute image analysis, according to a method that is identical to that for measuring an average value of an equivalent circle diameter of a crystal particle and a standard deviation of an equivalent circle diameter of a crystal particle as described above, and providing an obtained "maximum/minimum" as an aspect ratio.

Furthermore, a crystal particle in a substrate for mounting a light-emitting element according to the present disclosure may be provided in such a manner that a skewness of a distribution curve of an equivalent circle diameter thereof is greater than 0. Herein, a distribution curve of an equivalent circle diameter of a crystal particle refers to a curve that indicates a distribution of an equivalent circle diameter of a crystal particle where a horizontal axis in a 2-dimensional graph is an equivalent circle diameter and a vertical axis is a number of a crystal particle, and indicates a distribution range of an equivalent circle diameter of a crystal particle.

Furthermore, a skewness is an index that indicates asymmetry of a distribution and is capable of being obtained by using a function SKEW that is included in Excel (a registered trademark, Microsoft Corporation).

Additionally, a skewness that is greater than 0 means that, on a distribution curve of an equivalent circle diameter of a crystal particle, a number of a particle crystal that has an equivalent circle diameter that is less than an average value of an equivalent circle diameter of a crystal particle A is greater than a number of a particle crystal that has an equivalent circle diameter that is greater than the average value of an equivalent circle diameter of a crystal particle A.

Hence, if such a configuration is satisfied, a reflectance is further improved while a divisibility is maintained because a rate of a crystal particle that has an equivalent circle diameter that is less than an average value of an equivalent circle diameter A that contributes to reduction of diffused reflection of visible light is high.

Additionally, it is sufficient to calculate a skewness of a distribution curve of an equivalent circle diameter of a crystal particle from data of an equivalent circle diameter of a crystal particle that is obtained by a measurement method as described above.

Furthermore, a substrate for mounting a light-emitting element according to the present disclosure may be provided in such a manner that it has a pore, a porosity thereof is 4% by surface area or greater and 7% by surface area or less, and an average value of a distance between centroids of a pore is 3 μm or greater and 9 μm or less. If such a configuration is satisfied, a reflectance and a divisibility are improved because a pore effectively contributes to improvement of a reflectance and a crack is readily generated so as to link pores to one another.

Herein, it is sufficient to obtain a porosity by not providing a crystal particle but providing a pore as a target and applying a technique of particle analysis of image analysis software "A zo-kun" to execute image analysis, according to a method that is identical to that for measuring an average value of an equivalent circle diameter of a crystal particle and a standard deviation of an equivalent circle diameter of a crystal particle as described above. Herein, for an analysis condition of image analysis software "A zo-kun", it is sufficient that a lightness of a crystal particle is "light", a method for binarization is "manual", a small graphic elimination surface area is 0.002 μm, and a threshold value that is an index that indicates light and dark of an image is 50 or greater and 250 or less.

Furthermore, it is sufficient to obtain an average value of a distance between centroids of a pore by not applying a technique of particle analysis of "A zo-kun" but applying a technique of analysis of variance of "A zo-kun" to execute image analysis in a method that is identical to that for measuring a porosity as described above.

Furthermore, a substrate for mounting a light-emitting element according to the present disclosure may be provided in such a manner that, when C is an average value of a distance between centroids of a pore and D is a standard deviation of a distance between centroids of a pore, a ratio of D/C is less than 0.7. If such a configuration is satisfied, a divisibility is improved because a crack is readily generated so as to link pores to one another.

Next, an example of a manufacturing method for a substrate for mounting a light-emitting element according to the present disclosure will be explained.

First, an alumina ($Al_2O_3$) powder and a calcium carbonate ($CaCO_3$) powder, a magnesium hydroxide ($Mg(OH)_2$) powder, and a silicon oxide ($SiO_2$) powder that are sintering aids are prepared.

Herein, for an alumina powder, 2 types of alumina powders with different average particle diameters (a first alumina powder and a second alumina powder) are prepared. Herein, it is assumed that an average particle diameter of a first alumina powder is 5 or more and 8 or less times greater than an average particle diameter of a second alumina powder. Then, such a first alumina powder and a second alumina powder are compounded in an appropriate proportion and pulverized in such a manner that a pulverized particle size that is measured by a laser diffraction/scattering method is 2.6 μm or greater and 3.0 μm or less, so that a primary raw material powder is obtained. Additionally, a particle diameter of an aggregated particle where a plurality of microparticles are aggregated therein is also measured in a laser diffraction/scattering method, so that a practical particle diameter of an alumina powder is less than an average particle diameter that is measured by such a laser diffraction/scattering method.

Then, a primary raw material powder and respective powders that are sintering aids (a calcium carbonate powder, a magnesium hydroxide powder, and a silicon oxide powder) are weighed in such a manner that Al is 97% by mass or more as a value of an $Al_2O_3$ equivalent among 100% by mass of all components that constitute a substrate for mounting a light-emitting element.

Then, a primary raw material powder, respective powders that are sintering aids, 3 parts by mass or more and 10 parts by mass or less of a binder such as a water-soluble acryl resin, and 20 parts by mass or more and 60 parts by mass or less of a solvent, per 100 parts by mass of a total of the primary raw material powder and the respective powders that are sintering aids are put, mixed, and agitated in an agitator so as to obtain a slurry.

Then, a sheet is formed by using such a slurry according to a doctor blade method. Alternatively, a sheet is formed by using a granule that is obtained by spraying and granulating a slurry in a spray-granulating device (a spray dryer) according to a roll compaction method.

Then, a sheet as described above is processed by mold pressing or laser processing, so that a molded body with a predetermined product shape or a product-approximating shape is obtained.

Then, an obtained molded body is put in a firing furnace under an air (oxidation) atmosphere and held and fired at a temperature with a maximum temperature of 1510° C. or higher and 1560° C. or lower for 0.2 hours or more and 4 hours or less so as to obtain a sintered body. Thus, a molded body where a primary raw material powder with a pulverized particle size as described above is used therein is fired at a maximum temperature as described above, so that it is possible to provide an average value of an equivalent circle diameter of a crystal particle that is 1.1 µm or greater and 1.8 µm or less and a standard deviation of an equivalent circle dimeter thereof that is 0.6 µm or greater and 1.4 µm or less.

Then, a surface of such a sintered body is polished so as to obtain a substrate for mounting a light-emitting element according to the present disclosure. Additionally, it is preferable to provide an arithmetic mean roughness Ra of a surface that is 0.3 µm or less, by such polishing.

Additionally, in order that a crystal particle with an equivalent circle diameter that is 0.8 µm or less is 25% or more and 40% or less among 100% of a total number of a crystal particle in a substrate for mounting a light-emitting element according to the present disclosure, it is sufficient to execute firing in such a manner that a holding time at a maximum temperature is 0.5 hours or more and 2 hours or less.

Furthermore, in order that a number of a crystal particle with an equivalent circle diameter that is 2 µm or greater and an aspect ratio that is 2 or greater is 10 or more and 25 or less within a range of a surface area of 1344 µm$^2$ on a surface of a substrate for mounting a light-emitting element according to the present disclosure, it is sufficient to adjust a rate of temperature rise to a maximum temperature at a time of firing thereof.

Furthermore, in order that a skewness of a distribution curve of an equivalent circle diameter of a crystal particle in a substrate for mounting a light-emitting element according to the present disclosure is greater than 0, it is sufficient to provide, when a compounding ratio of a first alumina powder and a second alumina powder at a time when a primary raw material powder is prepared is E:F, a ratio E/F of such E and F that is 1 or less.

Furthermore, in order that a porosity is 4% by surface area or greater and 7% by surface area or less and an average value of a distance between centroids of a pore is 3 µm or greater and 9 µm or less in a substrate for mounting a light-emitting element according to the present disclosure, it is sufficient to use a primary raw material powder where a compounding ratio of a first alumina powder and a second alumina powder is 1:1 and execute holding and firing at a maximum temperature of 1520° C. or higher and 1530° C. or lower for 0.5 hours or more and 2 hours or less.

Furthermore, in order that a ratio D/C of a standard deviation of a distance between centroids of a pore D to an average value of a distance between centroids of a pore C is less than 0.7 in a substrate for mounting a light-emitting element according to the present disclosure, it is sufficient to use a primary raw material powder that is adjusted in such a manner that a compounding ratio of a first alumina powder to a second alumina powder is 1:1 and a pulverized particle size is 2.7 µm or greater and 2.9 µm or less.

Next, an example of a manufacturing method for the circuit board for mounting a light-emitting element 3 according to the present disclosure will be explained. First, a substrate for mounting a light-emitting element according to the present disclosure is prepared. Then, a paste that contains gold, silver, copper, a mixture thereof, or the like is applied onto a surface of a substrate for mounting a light-emitting element according to a thick-film printing method and heat-treated so as to provide the metal layer 2. Herein, after the metal layer 2 is formed, such a substrate for mounting a light-emitting element is cut and divided so as to provide pieces with a desired size by using a rotating disk where an industrial diamond is embedded therein or the like, or a multiple-piece process is executed thereon, so that the circuit board for mounting a light-emitting element 3 according to the present disclosure that includes the metal layer 2 on the substrate 1 is obtained.

Additionally, if a through-hole is provided on a substrate for mounting a light-emitting element by drill processing or laser processing, then such a through-hole is filled with a paste, then such a paste is applied to a front surface and a back surface of the substrate for mounting a light-emitting element so as to contact it, and subsequently heat treatment thereof is executed, it is possible to provide the circuit board for mounting a light-emitting element 3 that includes metal layers 2 on such a front surface and a back surface thereof and includes a penetration conductor that links them. Additionally, the metal layer(s) 2 and such a penetration conductor may be formed by a publicly-known plating method, sputtering method, active metal method, or the like, other than a method for formation with a paste.

Furthermore, a plating process may be executed on a part or entirety of a surface of the metal layer 2. Such a plating process is thus executed, so that it is possible to suppress oxidizing or corroding of the metal layer 2. For a type of plating, publicly-known plating is sufficient and there is provided, for example, gold plating, silver plating, nickel-gold plating, or the like.

Then, the light-emitting element 4 that is composed of a semiconductor is mounted on the metal layer 2 in the circuit board for mounting a light-emitting element 3 according to the present disclosure, so that it is possible to obtain the light-emitting element module 10 according to the present disclosure. Additionally, in order to provide a configuration of an example as illustrated in FIG. 1, it is sufficient to mount the light-emitting element 4 on the metal layer 2a, electrically connect the light-emitting element 4 and the metal layer 2b via the bonding wire 5, and subsequently cover it with the sealing member 6 that is composed of a resin or the like.

Hereinafter, practical examples according to the present disclosure will be explained specifically, and the present disclosure is not limited to such practical examples.

Practical Example 1

Samples where an average value of an equivalent circle diameter of a crystal particle and a standard deviation of an equivalent circle diameter of a crystal particle were different were fabricated and a reflectance and a divisibility were evaluated.

First, an alumina powder that was a main raw material and a calcium carbonate powder, a magnesium hydroxide powder, and a silicon oxide powder that were sintering aids were prepared. Herein, for the alumina powder, 2 types of alumina powders with different average particle diameters (a first alumina powder and a second alumina powder) were prepared. Herein, an average particle diameter of the first alumina powder is 6 times greater than an average particle diameter of the second alumina powder. Then, such a first alumina powder and a second alumna powder were compounded in an appropriate proportion and pulverized in such a manner that a pulverized particle size that was measured by a laser diffraction/scattering method was a value in Table 1, so that a primary raw material powder was obtained.

Then, the primary raw material powder and respective powders that were sintering aids (the calcium carbonate powder, the magnesium hydroxide powder, and the silicon oxide powder) were weighed in such a manner that, among 100% by mass of all components that constituted a substrate for mounting a light-emitting element, 99% by mass was Al as a value of an $Al_2O_3$ equivalent and 1% by mass of a balance thereof was a total of silicon, calcium, and magnesium as values of $SiO_2$, CaO, and MgO equivalents, respectively.

Then, the primary raw material powder, the respective powders that were sintering aids, and 7 parts by mass of a binder that was a water-soluble acryl resin and 50 parts by mass of water, per 100 parts by mass of a total of the primary raw material powder and the respective powders that were sintering aids, were put, mixed, and agitated in an agitator so as to obtain a slurry.

Then, a sheet was formed by using a granule that was obtained by spraying and granulating the obtained slurry in a spraying-granulating device, according to a roll compaction method. Additionally, a thickness of such a sheet was adjusted in such a manner that a thickness after firing was 1 mm.

Then, the sheet as described above was processed by mold pressing so as to obtain a molded body where a (vertical× horizontal) size after firing was 110 mm×110 mm.

Then, the obtained molded body was put in a firing furnace under air atmosphere and held and fired at a maximum temperature as illustrated in Table 1 for 4 hours so as to obtain a sintered body. Additionally, a rate of temperature rise to the maximum temperature was 1100° C./h.

Then, a surface of such a sintered body was polished in such a manner that an arithmetic mean roughness Ra of the surface was 0.3 µm, so that each sample was obtained.

Then, mirror polishing was executed from a surface of each sample to a depth of 10 µm and thermal etching was executed at a temperature that was approximately 100° C. lower than a firing temperature thereof. Then, observation thereof was executed at a 3000-fold magnification by using an SEM and a range where a surface area thereof was 1344 µm² (where a length in a horizontal direction was 42 µm and a length in a vertical direction was 32 µm) was image-captured. Then, a contour of a crystal particle was traced on an image-captured photograph and subsequently image analysis thereof was executed by applying a technique of particle analysis of image analysis software "A zo-kun" thereto, so that an average value of an equivalent circle diameter of a crystal particle and a standard deviation of an equivalent circle diameter of a crystal particle were obtained. Herein, for an analysis condition of image analysis software "A zo-kun", a lightness of a crystal particle was "light", a method for binarization was "manual", a small graphic elimination surface area was 0.002 µm, and a threshold value that was an index that indicated light and dark of an image was 100.

Then, measurement of a surface of each sample was executed on a condition of a standard light source D65, a wavelength range of 360 to 740 nm, a field of view of 10°, and an illumination diameter of 3×5 mm by using a spectrophotometric colorimeter (produced by Minolta, Inc., CM-3700A) and a reflectance for each sample at 500 nm was obtained.

Furthermore, a divisibility for each sample was evaluated. First, cutting of each sample was executed by using a rotating disk where diamond abrasive grains with a grain size of 1 µm were laid on a surface of each sample, at a rotational speed of 2000 rpm. Herein, a load current of a rotational shaft of the rotating disk was measured. Then, each sample was ranked in ascending order of such load currents of the samples. Herein, a sample with a minimum load current was ranked at a top thereof and a sample with a maximum load current was ranked at a bottom thereof. Herein, it was indicated that division thereof was facilitated as a load current was decreased. Results are illustrated in Table 1.

TABLE 1

| Sample No. | Pulverized particle size (µm) | Maximum temperature (° C.) | Equivalent circle diameter of crystal particle | | | Reflectance (%) | Ranking of divisibility |
| --- | --- | --- | --- | --- | --- | --- | --- |
| | | | Average value A (µm) | standard deviation B (µm) | B/A | | |
| 1 | 2.8 | 1500 | 0.9 | 0.5 | 0.56 | 93.9 | 11 |
| 2 | 2.5 | 1510 | 1.1 | 0.5 | 0.45 | 93.6 | 10 |
| 3 | 2.6 | 1510 | 1.1 | 0.6 | 0.55 | 93.3 | 9 |
| 4 | 2.8 | 1520 | 1.3 | 0.8 | 0.62 | 93.0 | 8 |
| 5 | 2.8 | 1530 | 1.4 | 0.9 | 0.64 | 92.7 | 7 |
| 6 | 2.8 | 1540 | 1.5 | 1.0 | 0.67 | 92.5 | 6 |
| 7 | 2.8 | 1550 | 1.6 | 1.2 | 0.75 | 92.0 | 5 |
| 8 | 2.8 | 1560 | 1.7 | 1.3 | 0.76 | 91.7 | 4 |
| 9 | 3.0 | 1560 | 1.7 | 1.4 | 0.82 | 91.2 | 3 |
| 10 | 2.8 | 1570 | 1.8 | 1.5 | 0.83 | 90.6 | 2 |
| 11 | 2.8 | 1580 | 1.9 | 1.6 | 0.84 | 90.0 | 1 |

As illustrated in Table 1, for sample Nos. 3 to 9, relative to sample Nos. 1, 2, 10, and 11, a reflectance was 91.2% or greater and ranking of a divisibility was 9th or higher. From such a result, it was found that a substrate for mounting a light-emitting element where an average value of an equivalent circle diameter of a crystal particle was 1.1 µm or greater and 1.8 µm or less and a standard deviation of an equivalent circle diameter of a crystal particle was 0.6 µm or greater and 1.4 µm or less had both a high reflectance and a high divisibility.

Furthermore, for sample Nos. 4 to 8, among sample Nos. 3 to 9, a reflectance was 91.7% or greater and ranking of a divisibility was 8th or higher. From such a result, it was found that a substrate for mounting a light-emitting element where a ratio B/A of a standard deviation of an equivalent circle diameter of a crystal particle B to an average value of an equivalent circle diameter of a crystal particle A was 0.6 or greater and 0.8 or less had a further improved reflectance and divisibility.

Practical Example 2

Next, samples where a number rate of crystal particles with an equivalent circle diameter that was 0.8 µm or less was different were fabricated and a reflectance and a divisibility were evaluated.

Additionally, a fabrication method for each sample was similar to a fabrication method for sample No. 6 in Practical Example 1 except that firing was executed in such a manner that a holding time at a maximum temperature was a value in Table 2. Additionally, sample No. 12 was identical to sample No. 6 in Practical Example 1.

Then, a number rate of crystal particles with an equivalent circle diameter that was 0.8 μm or less for each sample was calculated by applying a technique of particle analysis of image analysis software "A zo-kun" to execute image analysis, according to a method that was identical to a method for obtaining an average value of an equivalent circle diameter or a standard deviation of an equivalent circle diameter in Practical Example 1.

Then, a reflectance and a divisibility for each sample were evaluated according to a method that was identical to that in Practical Example 1.

Results are illustrated in Table 2. Additionally, ranking of a divisibility in Table 2 is provided by comparing only samples that are illustrated in Table 2. Furthermore, in Table 2, a number rate of crystal particles with an equivalent circle diameter that was 0.8 μm or less is simply described as a number rate.

TABLE 2

| Sample No. | Holding time at maximum temperature (hours) | Number rate (%) | Reflectance (%) | Ranking of divisibility |
|---|---|---|---|---|
| 12 | 4 | 23 | 92.5 | 1 |
| 13 | 2 | 25 | 92.7 | 2 |
| 14 | 1 | 31 | 92.8 | 3 |
| 15 | 0.5 | 40 | 93.0 | 4 |
| 16 | 0.2 | 42 | 93.2 | 5 |

As illustrated in Table 2, for sample Nos. 13 to 15, relative to sample Nos. 12 and 16, a reflectance was 92.7% or greater and ranking of a divisibility was 4th or higher. From such a result, it was found that a substrate for mounting a light-emitting element where crystal particles with an equivalent circle diameter that was 0.8 μm or less were 25% or more and 40% or less had a further improved reflectance and divisibility.

Practical Example 3

Next, samples where the number of crystal particles with an equivalent circle diameter that was 2 μm or greater and an aspect ratio that was 2 or greater was different were fabricated and a reflectance and a divisibility were evaluated.

Additionally, a fabrication method for each sample was similar to a fabrication method for sample No. 14 in Practical Example 2 except that a primary raw material powder where mixing was executed in such a manner that a rate of temperature rise to a maximum temperature at a time of firing was a value in Table 3 was used. Additionally, sample No. 17 was identical to sample No. 14 in Practical Example 2.

Then, the number of crystal particles with an equivalent circle diameter that was 2 μm or greater and an aspect ratio that was 2 or greater for each sample was calculated by applying a technique of particle analysis of image analysis software "A zo-kun" to execute image analysis, according to a method that was identical to a method for obtaining an average value of an equivalent circle diameter or a standard deviation of an equivalent circle diameter in Practical Example 1, and providing an obtained "maximum/minimum" as an aspect ratio.

Then, a reflectance and a divisibility for each sample were evaluated according to a method that was identical to that in Practical Example 1.

Results are illustrated in Table 3. Additionally, ranking of a divisibility in Table 3 is provided by comparing only samples that are illustrated in Table 3. Furthermore, in Table 3, the number of crystal particles with an equivalent circle diameter that was 2 μm or greater and an aspect ratio that was 2 or greater was simply described as the number of crystal particles.

TABLE 3

| Sample No. | Rate of temperature rise (° C./h) | Number of crystal particles (number) | Reflectance (%) | Ranking of divisibility |
|---|---|---|---|---|
| 17 | 1100 | 9 | 92.8 | 5 |
| 18 | 1050 | 10 | 92.7 | 4 |
| 19 | 800 | 18 | 92.5 | 3 |
| 20 | 400 | 25 | 92.1 | 2 |
| 21 | 350 | 26 | 91.5 | 1 |

As illustrated in Table 3, for sample Nos. 18 to 20, relative to sample Nos. 17 and 21, a reflectance was 92.1% or greater and ranking of a divisibility was 4th or higher. From such a result, it was found that a substrate for mounting a light-emitting element where the number of crystal particles with an equivalent circle diameter that was 2 μm or greater and an aspect ratio that was 2 or greater was 10 or more and 25 or less had a further improved reflectance and divisibility.

An additional effect(s) or variation(s) can readily be derived by a person(s) skilled in the art. Hence, a broader aspect(s) of the present invention is/are not limited to a specific detail(s) and a representative embodiment(s) as illustrated and described above. Therefore, various modifications are possible without departing from the spirit or scope of a general inventive concept that is defined by the appended claim(s) and an equivalent(s) thereof.

REFERENCE SIGNS LIST

1: base
2: metal layer
3: circuit board for mounting a light-emitting element
4: light-emitting element
5: bonding wire
6: sealing member
10: light-emitting element module

The invention claimed is:

1. A substrate for mounting a light-emitting element-that contains a crystal particle of aluminum oxide and is composed of an alumina-based ceramic that contains 97% by mass or more of Al as a value of an $Al_2O_3$ equivalent among 100% by mass of all components thereof, wherein an average value of an equivalent circle diameter of the crystal particle is 1.1 μm or greater and 1.8 μm or less and a standard deviation of an equivalent circle diameter thereof is 0.6 μm or greater and 1.4 μm or less, wherein a number of a crystal particle with an equivalent circle diameter that is 2 μm or greater and an aspect ratio that is 2 or greater is 10 or more and 25 or less, within a range of a surface area of 1344 μm² on a surface thereof.

2. The substrate for mounting a light-emitting element according to claim 1, wherein a ratio of B/A is 0.6 or greater and 0.8 or less where A is an average value of an equivalent circle diameter of the crystal particle and B is a standard deviation of an equivalent circle diameter of the crystal particle.

3. The substrate for mounting a light-emitting element according to claim 1, wherein a crystal particle with an equivalent circle diameter that is 0.8 μm or less is at 25% or more and 40% or less among 100% of a total number of the crystal particle.

4. The substrate for mounting a light-emitting element according to claim 1, wherein a skewness of a distribution curve of an equivalent circle diameter of the crystal particle is greater than 0.

5. The substrate for mounting a light-emitting element according to claim 1, having a plurality of pores, wherein a porosity thereof is 4% by surface area or greater and 7% by surface area or less and an average value of distances between centroids of the plurality of pores is 3 μm or greater and 9 μm or less.

6. A circuit board for mounting a light-emitting element, comprising a base that is provided as a piece from the substrate for mounting a light-emitting element according to claim 1 and a metal layer that is located on the base.

7. A light-emitting element module, comprising the circuit board for mounting a light-emitting element according to claim 6 and a light-emitting element that is located on the metal layer.

* * * * *